(12) United States Patent
Ahn

(10) Patent No.: US 9,219,094 B2
(45) Date of Patent: Dec. 22, 2015

(54) BACKSIDE ILLUMINATED IMAGE SENSOR

(75) Inventor: Jung-chak Ahn, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 666 days.

(21) Appl. No.: 13/542,918

(22) Filed: Jul. 6, 2012

(65) Prior Publication Data
US 2013/0015325 A1 Jan. 17, 2013

(30) Foreign Application Priority Data

Jul. 11, 2011 (KR) ........................ 10-2011-0068550

(51) Int. Cl.
*H01L 27/00* (2006.01)
*H01L 27/146* (2006.01)

(52) U.S. Cl.
CPC ...... *H01L 27/1464* (2013.01); *H01L 27/14638* (2013.01); *H01L 27/14621* (2013.01); *H01L 27/14627* (2013.01); *H01L 27/14643* (2013.01)

(58) Field of Classification Search
CPC .................. H01L 27/1464; H01L 27/14621; H01L 27/14643; H01L 27/14638; H01L 27/14627
USPC ................. 250/208.1; 257/432, 447
See application file for complete search history.

(56) References Cited

U.S. PATENT DOCUMENTS

| | | | | |
|---|---|---|---|---|
| 5,920,092 A | * | 7/1999 | Watanabe | 257/292 |
| 7,898,051 B2 | * | 3/2011 | Uya | 257/438 |
| 2006/0187327 A1 | * | 8/2006 | Mabuchi et al. | 348/294 |
| 2008/0131588 A1 | * | 6/2008 | Hwang et al. | 427/74 |
| 2008/0283726 A1 | * | 11/2008 | Uya et al. | 250/208.1 |
| 2009/0201395 A1 | | 8/2009 | Manabe et al. | |
| 2010/0116971 A1 | * | 5/2010 | McCarten et al. | 250/214.1 |
| 2011/0176023 A1 | * | 7/2011 | Jung et al. | 348/222.1 |

FOREIGN PATENT DOCUMENTS

| | | |
|---|---|---|
| JP | 2003-037262 A | 2/2003 |
| JP | 2004-103964 A | 4/2004 |
| KR | 10-2009-0034763 A | 4/2009 |

* cited by examiner

*Primary Examiner* — Georgia Y Epps
*Assistant Examiner* — Kevin Wyatt
(74) *Attorney, Agent, or Firm* — Lee & Morse, P.C.

(57) ABSTRACT

A backside illuminated image sensor includes a semiconductor substrate having a front side and a backside facing each other, a light receiving element in the semiconductor substrate, the light receiving element being configured to convert light incident on the backside of the semiconductor substrate to an electrical signal, a first semiconductor layer on the front side of the semiconductor substrate, and a second semiconductor layer on the backside of the semiconductor substrate, the second semiconductor layer being connected to a voltage source.

20 Claims, 8 Drawing Sheets

BACKSIDE ILLUMINATED IMAGE SENSOR

CROSS-REFERENCE TO RELATED APPLICATIONS

This application claims the benefit of Korean Patent Application No. 10-2011-0068550, filed on Jul. 11, 2011, in the Korean Intellectual Property Office, the disclosure of which is incorporated herein in its entirety by reference.

BACKGROUND

1. Field

The inventive concept relates to an image sensor, and more particularly, to a backside illuminated image sensor in which crosstalk between adjacent pixels is minimized.

2. Description of the Related Art

Recently, a backside illuminated image sensor has been developed. A conventional backside illuminated image sensor may include a wiring layer on a front side of a semiconductor layer, so light incident from a backside of the semiconductor layer may be converted to an electrical image. Further, the conventional backside illuminated image sensor may include a pixel array with pixels, each pixel having a photodiode with a photoelectric conversion function. Also, each pixel may include a filter, so that the photodiode may photoelectrically covert only light having a predetermined wavelength.

SUMMARY

The inventive concept provides a backside illuminated image sensor, in which crosstalk between pixels may be prevented or substantially minimized.

According to an aspect of the inventive concept, there is provided a backside illuminated image sensor, including a semiconductor substrate having a front side and a backside facing each other, a light receiving element in the semiconductor substrate, the light receiving element being configured to convert light incident on the backside of the semiconductor substrate to an electrical signal, a first semiconductor layer on the front side of the semiconductor substrate, and a second semiconductor layer on the backside of the semiconductor substrate, the second semiconductor layer being connected to a voltage source.

The semiconductor substrate may be a p-type silicon substrate.

The first and second semiconductor layers may be p+type semiconductor layers.

The voltage source may be configured to apply voltage to the second semiconductor layer, the voltage source being a charge pump circuit outputting voltage or an external voltage source.

The voltage source may be configured to apply negative voltage to the second semiconductor layer.

The first semiconductor layer may be grounded.

The light receiving element may be a photodiode.

The backside illuminated image sensor may further include a wiring layer on the front side of the semiconductor substrate, and a filter layer and a lens layer on the backside of the semiconductor substrate.

The semiconductor substrate may have a thickness of about 10 μm.

The first and second semiconductor layers may be configured to have a potential difference therebetween.

The first and second semiconductor layers may be configured to have an electric field therebetween directed toward the first semiconductor layer.

A system may include the backside illuminated image sensor, a processor communicating with the image sensor via a bus, and an input/output unit communicating with the bus.

According to an aspect of the inventive concept, there is provided a backside illuminated image sensor, including a semiconductor substrate having a front side and a backside facing each other, light being incident on the backside of the semiconductor substrate, a light receiving element between the front side and backside of the semiconductor substrate, a first semiconductor layer on the front side of the semiconductor substrate, and a second semiconductor layer on the backside of the semiconductor substrate, the first and second semiconductor layers being oppositely charged.

The light receiving element may be on the front side of the semiconductor layer, and the second semiconductor layer may be positively charged.

The first semiconductor layer may be grounded, and the second semiconductor layer may be connected to a negative voltage source.

According to an aspect of the inventive concept, there is provided a backside illuminated image sensor, including a light receiving element in a semiconductor substrate, and a semiconductor layer on a backside of the semiconductor substrate, the semiconductor layer being connected to an external voltage source supplying negative voltage.

The semiconductor layer may be a p+ type semiconductor layer.

The backside illuminated image sensor may further include a wiring layer on a front side of the semiconductor substrate, and a filter layer and a lens layer on the backside of the semiconductor substrate.

The backside illuminated image sensor may further include an additional semiconductor layer on the front side of the semiconductor substrate.

The first semiconductor layer may be a p+ type semiconductor layer and may be grounded.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
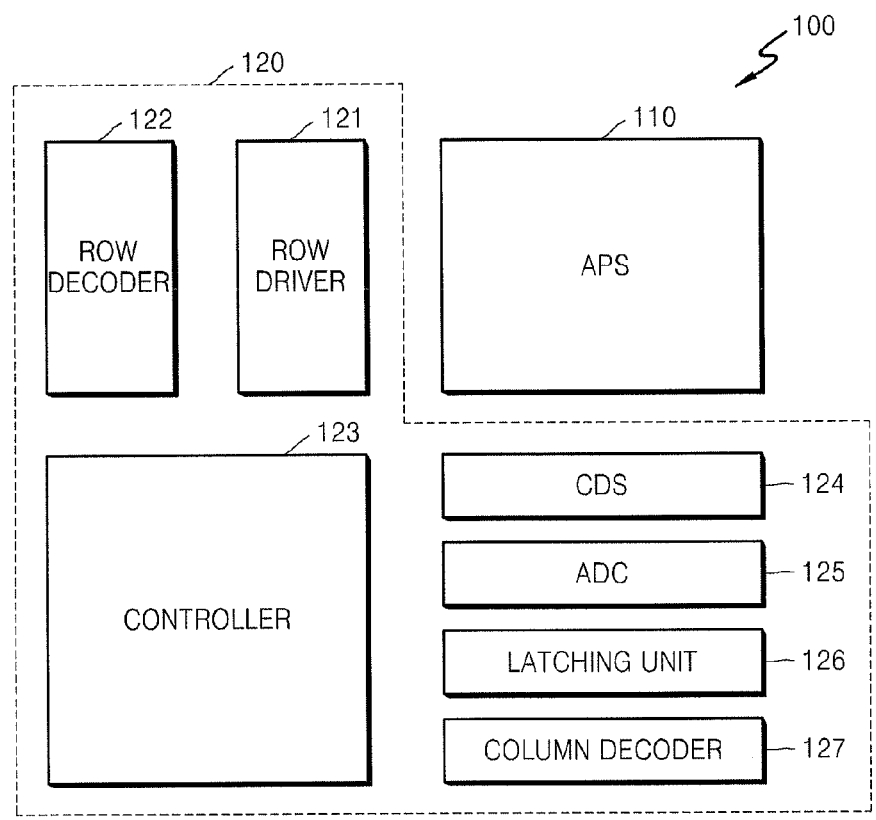
FIG. 1 illustrates a schematic block diagram of a backside illuminated image sensor according to an embodiment of the inventive concept.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of elements and regions may be exaggerated for clarity of illustration. It will also be understood that when an element (or layer) is referred to as being "on" another element or substrate, it can be directly on the other element or substrate, or intervening elements may also be present. In addition, it will also be understood that when an element is referred to as being "between" two elements, it can be the only element between the two elements, or one or more intervening elements may also be present. Like reference numerals refer to like elements throughout.

Figure 2:
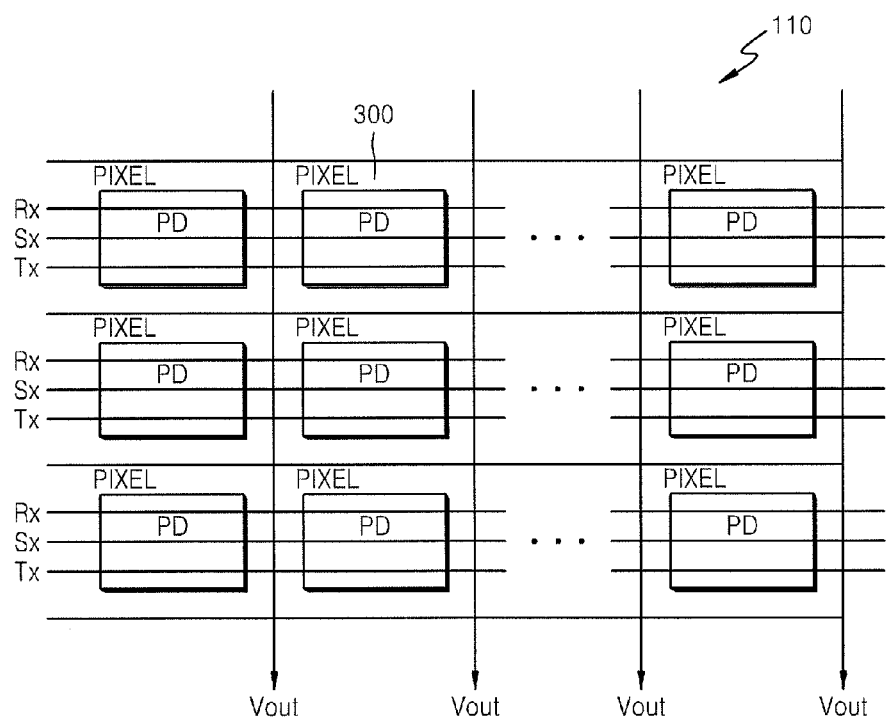
FIG. 2 illustrates a circuit diagram of an active pixel sensor (APS) array of a backside illuminated image sensor according to an embodiment of the inventive concept.

FIG. 1 is a schematic block diagram illustrating a backside illuminated image sensor 100 according to an embodiment of the inventive concept. FIG. 2 is a circuit diagram illustrating an active pixel sensor (APS) array of the backside illuminated image sensor 100.

Figure 3:
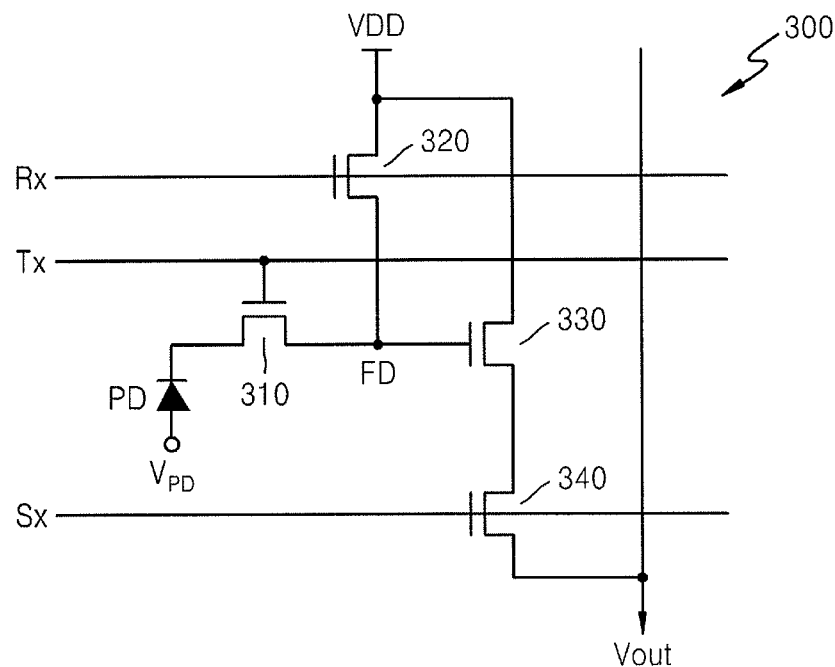
FIG. 3 illustrates a circuit diagram of a pixel of a backside illuminated image sensor according to an embodiment of the inventive concept.

Referring to FIG. 1, the backside illuminated image sensor 100 may include an APS array region 110 and a circuit region 120 formed to operate the APS array region 110. As illustrated in FIG. 2, the APS array region 110 may include a plurality of pixels, i.e., unit pixels 300, arranged in two dimensions, e.g., in a matrix, and a light receiving element PD in each pixel. Each unit pixel 300 may include an equivalent circuit, as illustrated in FIG. 3. An optical signal is converted to an electrical signal in the APS array region 110, and the APS array region 110 is driven by receiving various driving signals, e.g., a pixel selection signal Sx, a reset signal Rx, a transfer signal Tx, etc., from a row driver 121. Also, the converted electrical signal is supplied to a correlated double sampler (CDS) 124 via a vertical signal line (an output line Vout in FIG. 2). The circuit region 120 may include a controller 123, a row decoder 122, the row driver 121, the CDS 124, an analog-digital converter (ADC) 125, a latching unit 126, and a column decoder 127.

The controller 123 supplies a control signal to the row decoder 122 and the column decoder 127. The row driver 121 supplies various driving signals, which are needed to drive a plurality of pixels according to a decoding result of the row decoder 122, to the APS array region 110. For example, when pixels are arranged in a matrix, a driving signal is supplied to each row.

The CDS 124 receives an electrical signal generated in the APS array region 110 via the vertical signal line (the output line Vout in FIG. 2) and samples and holds the received electrical signal. That is, by double-sampling a predetermined noise signal and a signal level due to the generated electrical signal, a difference level corresponding to a difference between the noise level and the signal level may be output.

The ADC 125 converts an analog signal corresponding to the difference level output by the CDS 124 into a digital signal. The latching unit 126 may latch a digital signal, and the latched signal is sequentially output to an image signal processor (not shown) according to a decoding result of the column decoder 127.

FIG. 3 is a circuit diagram illustrating the unit pixel 300 of the backside illuminated image sensor 100. The unit pixel 300 may include four transistors, but may also include three or five transistors or may have a photogate structure that is similar to a structure including four transistors.

Referring to FIG. 3, each unit pixel 300 include a light receiving element PD that receives light to generate and accumulate photo charges and active elements, e.g., transistors, transmitting or processing a light signal incident on the light receiving element PD. Examples of the active elements may include a transfer element 310, a reset element 320, a driving element 330, and a selection element 340.

The light receiving element PD generates and accumulates charges corresponding to the incident light, and may be, e.g., a photodiode, a photo transistor, a photogate, a pinned photodiode (PPD) or the like, or a combination of these. The light receiving element PD is connected to the transfer element 310 that transmits charged optical charges to a floating diffusion (FD) region.

The FD region receives the charges accumulated in the light receiving element PD. Also, the FD region is electrically connected to the driving element 330, for example, to a driving transistor, to control the driving element 330.

The transfer element 310, for example, a transfer transistor, directly transmits the charges from the light receiving element PD to the FD region. The transfer element 310 is controlled by using a transfer signal Tx.

The reset element 320, for example, a reset transistor, resets the FD region periodically. A source of the reset element 320 is connected to the FD region and a drain of the reset element 320 is connected to a voltage VDD. Also, the reset element 320 is driven by using a reset signal Rx. Accordingly, when the reset element 320 is turned on by using the reset signal Rx, the voltage VDD connected to the drain of the reset element 320 is transferred to the FD region.

The driving element 330, for example, a driving transistor, functions as a source follower buffer amplifier in combination with a static current source (not shown) located outside the unit pixel 300, and amplifies a variation in an electrical potential of the FD region, to which the optical charges accumulated in the light receiving element PD are transferred, and outputs the same via an output line Vout.

The selection element 340, for example, a selection transistor, selects the unit pixel 300 that is to be read out row by row. The selection element 340 is driven by using a bias supplied via a row selection line Sx.

Also, the driving signal lines Tx, Rx, and Sx of the transfer element 310, the reset element 320, and the selection element 340 may be extended in a row direction (horizontal direction) such that a plurality of unit pixels 300 included in the same row may be driven at the same time, e.g., simultaneously.

An operation of a circuit of the unit pixel 300 illustrated in FIG. 3 will be described briefly. First, when the transfer transistor 310 and the reset transistor 320 are turned on, a power voltage VDD is transmitted to the light receiving element PD. Then the transfer transistor 310 and the reset transistor 320 are turned off, and a predetermined period of time is spent for optical integration in the light receiving element PD. Optical integration refers to a process in which electron-hole pairs are generated in proportion to light that is incident on the light receiving element PD from the outside. A potential of a source of the transfer transistor 310 is varied by using the generated signal in proportion to the amount of generated charges. When the transfer transistor 310 is turned on by using a transfer signal Tx that is input to a gate of the transfer transistor 310, the accumulated charges are transferred to the FD region, and a potential of the FD region is varied in proportion to an amount of the transferred charges. A gate bias of the driving transistor 330 is varied according to a variation in the potential of the FD region, and this eventually causes a variation in a source potential of the driving transistor 330. The driving transistor 330 is a source follower transistor which functions as a kind of signal amplifier, and reduces noise or an amount of a remaining current. When the selection transistor 340 is turned on by using a pixel selection signal Sx, a signal that is amplified by the driving transistor 330 is output to the outside via an output line Vout. The reset transistor 320 is turned on or off by the reset signal Rx. When the reset transistor 320 is turned on, a potential of the FD region becomes a power voltage VDD in order to output a reference value via the output line Vout, and waits for a next sensed signal. That is, the reset transistor 320 initializes the unit pixel 300.

Figure 4:
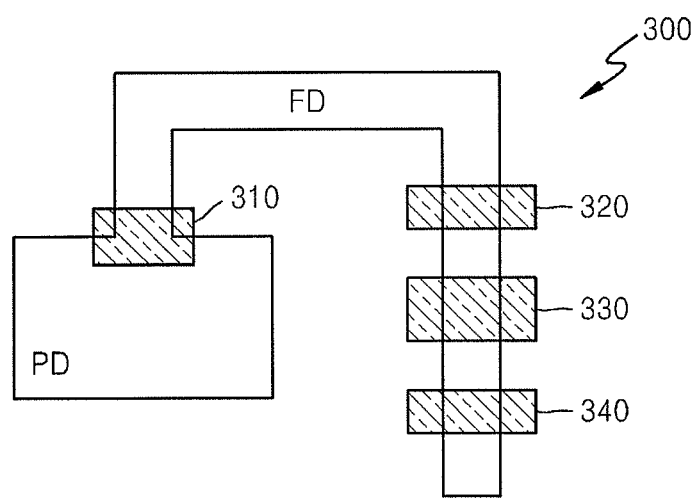
FIG. 4 illustrates a schematic layout of the pixel illustrated in FIG. 3.

FIG. 4 is a schematic layout illustrating the unit pixel 300 illustrated in FIG. 3.

Referring to FIG. 4, the APS array region 110 (see FIGS. 1 and 2) includes pixels arranged in a matrix. Thus, a substrate of the APS array region 110 may be divided into rectangular pixels 300 (see FIG. 2). A light receiving element PD may be located in each pixel 300 (see FIG. 2), and a floating diffusion (FD) region, the transfer transistor 310, the reset transistor 320, the driving transistor 330, and the selection transistor 340, which transfer and process signals that are photoelectrically converted in the light receiving element PD, may be located around the light receiving element PD.

Figure 5:
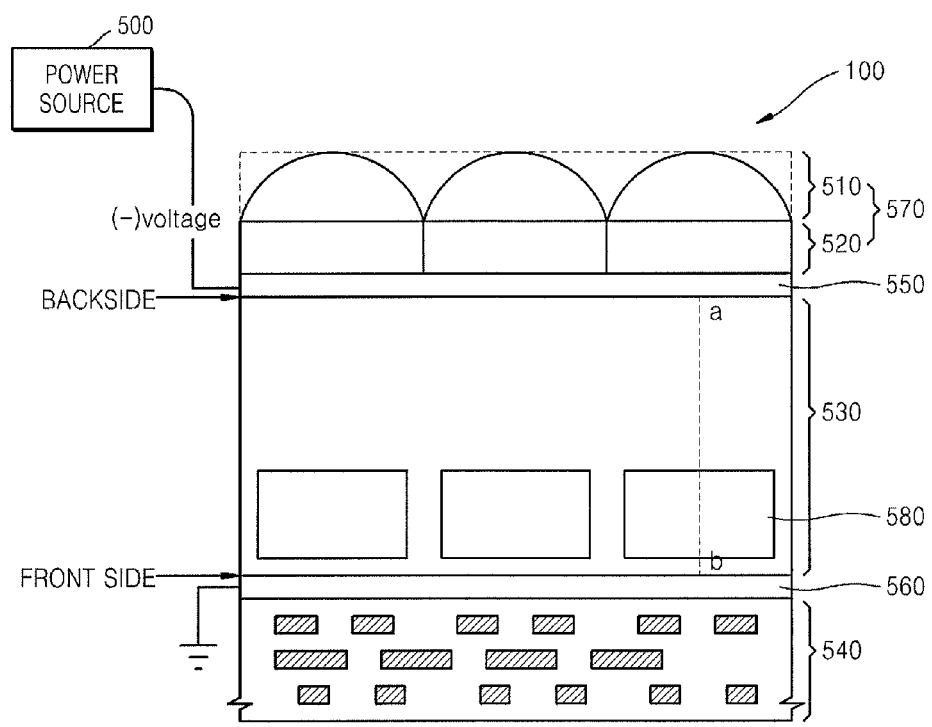
FIG. 5 illustrates a cross-sectional view of a backside illuminated image sensor according to an embodiment of the inventive concept.

FIG. 5 is a cross-sectional view illustrating the backside illuminated image sensor 100 according to an embodiment of the inventive concept.

Referring to FIG. 5, the backside illuminated image sensor 100 may include a semiconductor substrate 530, a first semiconductor layer 560, a second semiconductor layer 550, a wiring layer 540, an optical filter layer 570, and a receiving element 580. In detail, the optical filter layer 570 may be disposed at a backside of the semiconductor substrate 530, i.e., a side on which light is incident on, and the wiring layer 540 may be disposed at a front side of the semiconductor substrate 530.

A general image sensor may receive light through the front side of a semiconductor substrate, so a large amount of light may be absorbed in or lost through a thick interlayer insulating layer on the front side of the semiconductor substrate. Therefore, a final amount of focused light in the general image sensor may be small. For example, red light, which has a large wavelength, incident on the front side of a general image sensor may be lost and refracted when passing through the thick interlayer insulating layer of the semiconductor substrate, so that light may accumulate in the pixels and cause optical crosstalk between adjacent pixels. However, in the backside illuminated image sensor 100 according to the current embodiment of the inventive concept, light is incident through the backside of the semiconductor substrate 530, i.e., through the second semiconductor layer 550 that is opposite the wiring layer 540, thereby an amount of light reaching the light receiving element 580, e.g., without being disturbed by the wiring layer 540, may be increased.

The wiring layer 540 may have a structure in which wiring and an interlayer insulating layer are stacked. The wiring layer 540 may be formed of a conductive material, for example, a metal or an alloy layer containing at least two metals. The interlayer insulating layer may be formed of an insulating material, such as a silicon oxide. By repeatedly forming a wiring layer and forming an interlayer insulating layer, multi-layer wiring may be formed. The wiring layer 540 is formed at the front side of the semiconductor substrate 530, and the optical filter layer 570 is formed at the backside of the semiconductor substrate 530.

Therefore, active elements transmitting and processing photoelectrically converted signals are formed at the front side of the semiconductor substrate 530, and elements through which light is incident and passes through are formed at the backside of the semiconductor substrate 530. That is, active elements, e.g., the transfer transistor, the reset transistor, the driving transistor, and the selection transistor, and the wiring layer 540 may be formed at the front side of the semiconductor substrate 530. The optical filter layer 570 including a filter layer 520 and a lens layer 510 may be formed at the backside of the semiconductor substrate 530.

The filter layer 520 may include a plurality of filters corresponding to a plurality of light receiving elements 580 disposed below the filter layer 520, e.g., each filter may correspond to a respective light receiving element. For example, red (R), green (G), and blue (B) filters may be formed to correspond to the light receiving elements 580 including red (R), green (G), and blue (B) pixels. Alternatively, if an image sensor 100 includes an infrared light receiving element, an infrared filter corresponding to the infrared light receiving element may be formed as the filter layer 520.

The lens layer 510 may include a plurality of microlenses, such that light incident on the backside of the semiconductor substrate 530 may pass through the microlenses to be focused on the light receiving elements 580 in the corresponding pixels. Light passing through the microlenses in the lens layer 510 may be filtered through the filters in the filter layer 520, so light having predetermined wavelength ranges, i.e., corresponding to color filters R, G, or B or an infrared filter, may be incident on respective light receiving elements 580 of the corresponding pixels.

Also, a passivation layer (not shown) may be formed on an anti-reflective layer (not shown). The passivation layer may be an insulating layer that physically or chemically protects the backside illuminated image sensor 100 and may be formed of, for example, a silicon oxide ($SiO_2$).

The anti-reflective layer may be formed on the second semiconductor layer 550. The anti-reflective layer may prevent or minimize reflection of the incident light, so that most light is transmitted through the light receiving elements 580 to thereby improve light receiving performance of the backside illuminated image sensor 100. The anti-reflective layer may also be referred to as a bottom anti-reflective layer (BARL) due to the anti-reflective layer being formed below the microlenses 510 and the filter layer 520. The anti-reflective layer may be a single layer or a multi-layer.

The semiconductor substrate 530 may be formed by using an epitaxial wafer, which refers to a wafer formed by using an epitaxial method. While an epitaxial wafer is used as the semiconductor substrate 530 in the current embodiment of the inventive concept, other wafers, e.g., a polished wafer, an annealed wafer, and/or a silicon on insulator (SOI) wafer, etc., may also be used.

The semiconductor substrate 530 may be a p-type silicon substrate. When growing a p-type silicon substrate, an epitaxial layer may be grown such that p-type ions are included from the beginning or p-type ions may be injected into an epitaxial wafer to form a p-type silicon substrate. The first semiconductor layer 560 and the second semiconductor layer 550 may be p+ type semiconductor layers formed on opposite surfaces of the semiconductor substrate 530.

The thickness of the semiconductor substrate 530 may be adjusted to a predetermined thickness, e.g., about 10 μm, to improve convergence of light into the light receiving elements 580 and to minimize crosstalk. In detail, in order for light of a wavelength of about 600 nm or greater to be absorbed in the backside illuminated image sensor 100, a thickness of the semiconductor substrate 530 needs to be about 10 μm or greater. In order for light of a wavelength of 500 nm or greater to be absorbed in the backside illuminated image sensor 100, the thickness of the semiconductor substrate 530 needs to be about 5 μm or greater. Accordingly, in order to prevent light having a large wavelength, e.g., infrared light, from passing through the light receiving elements 580 and/or causing crosstalk, the thickness of the semiconductor substrate 530 may be adjusted. For example, the thickness of the semiconductor substrate 530 may be about 10 μm.

In contrast, for example, if the semiconductor substrate 530 is too thin, light with a long wavelength, e.g., visible light or infrared light, irradiated toward the backside of the semiconductor substrate 530 may not be completely converged into the light receiving elements 580, e.g., may be just transmitted through the light receiving elements 580 or may cause accumulation of electrons generated at the backside of the semiconductor substrate 530. As such, light not converging into the light receiving elements 580 may cause crosstalk, e.g., accumulated electrons may move toward light receiving elements 580 of adjacent pixels, thereby causing, e.g., color mixing. Accordingly, according to the current embodiment of the inventive concept, in order to prevent or substantially minimize light having a large wavelength, e.g., infrared light, from causing crosstalk, and to thereby prevent or substantially minimize color mixing and to increase sensitivity of the infrared light, the semiconductor substrate 530 may be formed to have the predetermined thickness.

The light receiving elements 580 may be near the surface of the semiconductor substrate 530, e.g., near the front surface, in order to facilitate the ion injection process, e.g., it may be difficult to form the light receiving elements 580 at a deep depth from the surface of the semiconductor substrate 530 due to the limitation in terms of ion injection. Further, the first semiconductor layer 560, i.e., a layer adjacent the front surface of the semiconductor substrate 530 and the light receiving elements 580, may be grounded, and a negative voltage may be directly applied to the backside of the semiconductor substrate 530, e.g., the negative voltage may be applied directly to the second semiconductor layer 550. Accordingly, loss of light not absorbed by the light receiving elements 580 may be prevented or substantially minimized.

That is, the second semiconductor layer 550 formed at the backside of the semiconductor substrate 530 may be connected to a voltage source 500, so the second semiconductor layer 550 may receive a power voltage from the outside or may use an output voltage via a charge pump circuit to apply voltage to the backside of the semiconductor substrate 530. The power voltage applied to the backside of the semiconductor substrate 530 is a negative voltage. By applying the negative voltage to the semiconductor substrate 530, a difference between a potential near the backside of the semiconductor substrate 530 and a potential of the light receiving elements 580 may be increased, e.g., a potential between points a-b in FIG. 5. As a result of the increased potential difference, holes are accumulated in the second semiconductor layer 550, i.e., where negative voltage is applied, so electrons generated at the backside of the semiconductor substrate 530 move toward the light receiving elements 580, i.e., adjacent the grounded semiconductor layer 560, to increase a contrast ratio. As such, crosstalk of electrons generated at the backside of the semiconductor substrate 530 may be prevented or substantially minimized.

Also, since the negative voltage is directly applied to the second semiconductor layer 550, a transparent electrode may not be necessary to apply a voltage to the semiconductor substrate. Therefore, a manufacturing process of the backside illuminated image sensor 100 may be simplified and costs may be reduced, while crosstalk may be prevented or substantially minimized without having to form a physical pixel definition layer between the light receiving elements 580.

The plurality of light receiving elements 580 may be separated from one another and may be formed at a predetermined depth from the front side of the semiconductor substrate 530. The plurality of light receiving elements 580 may generate electrons based on light incident on each of the light receiving elements 580. For example, the semiconductor substrate 530 may include p-type wells and the plurality of light receiving elements 580 may be doped with n-type dopants, and the plurality of light receiving elements 580 may be insulated or separated from one another via the p-type wells. According to embodiments, the light receiving elements 580 may be photodiodes (PD), phototransistors, photogates, pinned photodiodes (PDD), or a combination of these.

Figure 6A:
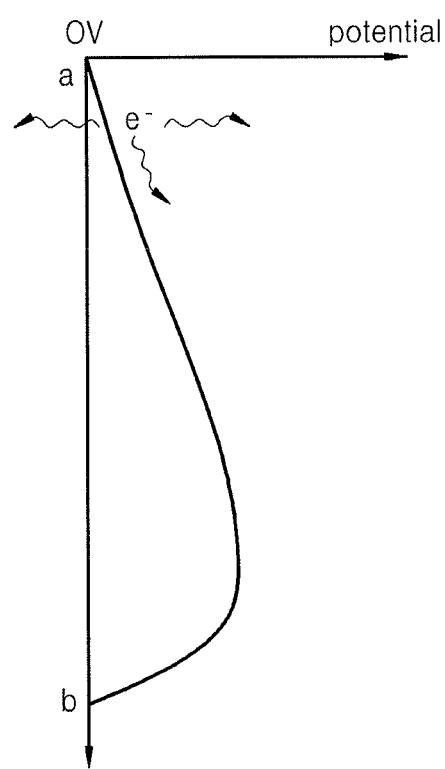
FIG. 6A illustrates a potential between points a-b when a negative voltage is not applied to a second semiconductor layer.
Figure 6B:
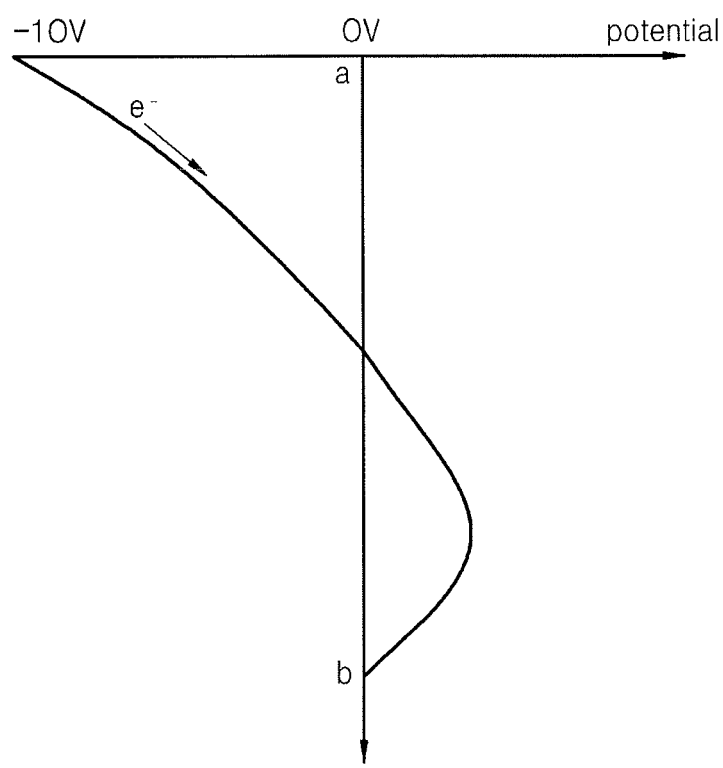
FIG. 6B illustrates a potential with between points a-b when a negative voltage is applied to the second semiconductor layer.

FIG. 6A illustrates a potential between points "a" and "b" in FIG. 5, when a negative voltage is not applied to the second semiconductor layer 550. FIG. 6B illustrates a potential between points "a" and "b" in FIG. 5, when the first semiconductor layer 560 is grounded and a negative voltage is applied to the second semiconductor layer 550 according to example embodiments.

Referring to FIG. 6A, when a negative voltage is not applied to the second semiconductor layer 550, electrons generated near the backside of the semiconductor substrate 530 according to light transmitted through the optical filter layer 570 move randomly in different directions. As such, the electrons do not necessarily move to the light receiving elements 580 of a corresponding pixel but may move to light receiving elements 580 of adjacent pixels, thereby causing crosstalk.

Referring to FIG. 6B, when a negative voltage is applied to the second semiconductor layer 550, a higher electric field is formed near the backside of the semiconductor substrate 530. Accordingly, electrons generated near the backside of the semiconductor substrate 530 move toward the light receiving elements 580 of the corresponding pixel, thereby avoiding moving toward light receiving elements 580 of adjacent pixels. As such, crosstalk may be prevented or substantially minimized.

That is, according to the present embodiment of the inventive concept, a negative voltage may be directly applied to the backside of the semiconductor substrate 530, i.e., directly to the second semiconductor layer 550 directly on the back surface of the semiconductor substrate 530, thereby controlling movement of electrons via the generated electric field. As such, formation of additional elements, e.g., a transparent electrode on the backside of the semiconductor substrate 530 for voltage application, may be avoided, thereby simplifying the manufacturing process of an image sensor and reducing manufacturing costs. In addition, as a higher electric field may be formed at the backside of the semiconductor substrate 530, color noise may be reduced to improve a signal to noise ratio (SNR), thereby providing a clear image.

Figure 7:
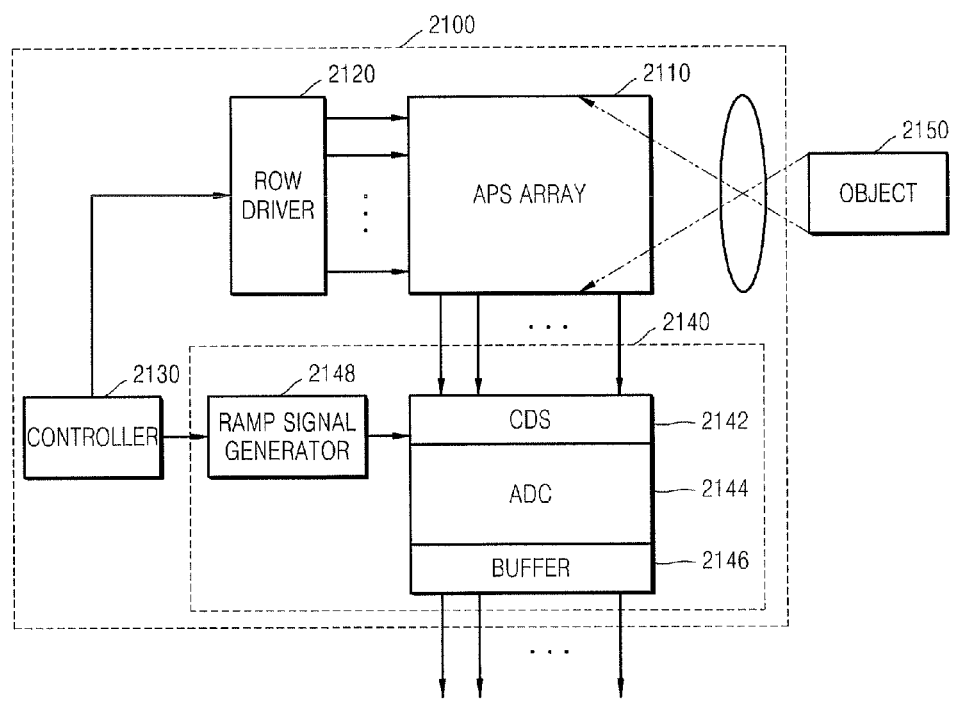
FIG. 7 illustrates a block diagram of a complementary metal oxide semiconductor (CMOS) image sensor, according to an embodiment of the inventive concept.

FIG. 7 is a block diagram illustrating a complementary metal oxide semiconductor (CMOS) image sensor 2100.

Referring to FIG. 7, the CMOS image sensor 2100 may include an APS array 2110, a controller 2130, a row driver 2120, and a pixel signal processor 2140. The APS array 2110 may be the backside illuminated image sensor 100 illustrated in FIG. 5. The APS array 2110 may include a plurality of pixels arranged in two dimensions, and each pixel may include a light receiving element performing a photoelectric conversion function. The APS array 2110, which is a backside illumination type, receives light that has been incident thereon without being disturbed by a wiring layer to generate charges. An electrical signal generated by converting light is supplied to the pixel signal processor 2140 via a vertical signal line. Pixel sensors in the APS array 2110 may be read out one by one and row by row. Accordingly, pixels of each row of the APS array 2110 are activated at the same time by using a row selection signal, which is an output of the row driver 2120.

Also, each pixel cell of the selected row supplies a signal corresponding to the received light to an output line of a corresponding column. In the APS array 2110, each column has a selection line, and pixel cells of each column are selectively output in response to the column selection signal. The rows in the APS array 2110 are activated in response to an output signal of the row driver 2120.

The controller 2130 controls the row driver 2120 and the pixel signal processor 2140 to appropriately process a pixel signal output from the APS array 2110. The pixel signal processor 2140 includes a CDS 2142, an ADC 2144, and a buffer 2146.

The CDS 2142 receives an electrical signal generated by the APS array 2110 via a vertical signal line and samples and holds the electrical signal. That is, by double-sampling a predetermined noise level and a signal level due to the generated electrical signal, a difference level corresponding to a difference between the noise level and the signal level is output. Then, the CDS 2142 may receive a value of a ramp signal generated in a ramp signal generator 2148 to compare with the difference level and the ramp signal value and may output a comparison result to an output end. The ramp signal generator 2148 may operate based on a control signal generated in the controller 2130.

The ADC 2144 converts an analog signal corresponding to the difference level to a digital signal. The buffer 2146 may include a column memory block (not shown) and a sense amplifier (not shown), and the column memory block may include a plurality of memories (not shown). The buffer 2146 may latch the digital signal, and the latched digital signal may be output to an image processor (not shown) sequentially according to a result of decoding performed by a column decoder (not shown).

The CMOS image sensor 2100 of FIG. 7 may further include an image processor (not shown) to be integrated as a semiconductor chip. The image processor performs appropriate image processing to digitized pixel signals to output image data. The CMOS image sensor 2100 senses an object that is captured through a lens by being controlled by the image processor, and the image processor may output the sensed image, to a display unit (not shown). The display unit may be any element that is capable of outputting an image. For example, the display unit may be a computer, a mobile phone, or other image output terminals. The CMOS image sensor 2100 illustrated in FIG. 7 includes the backside illuminated APS array 100 illustrated in FIG. 5. Accordingly, image data with little crosstalk between adjacent pixels and without error may be output.

Figure 8:
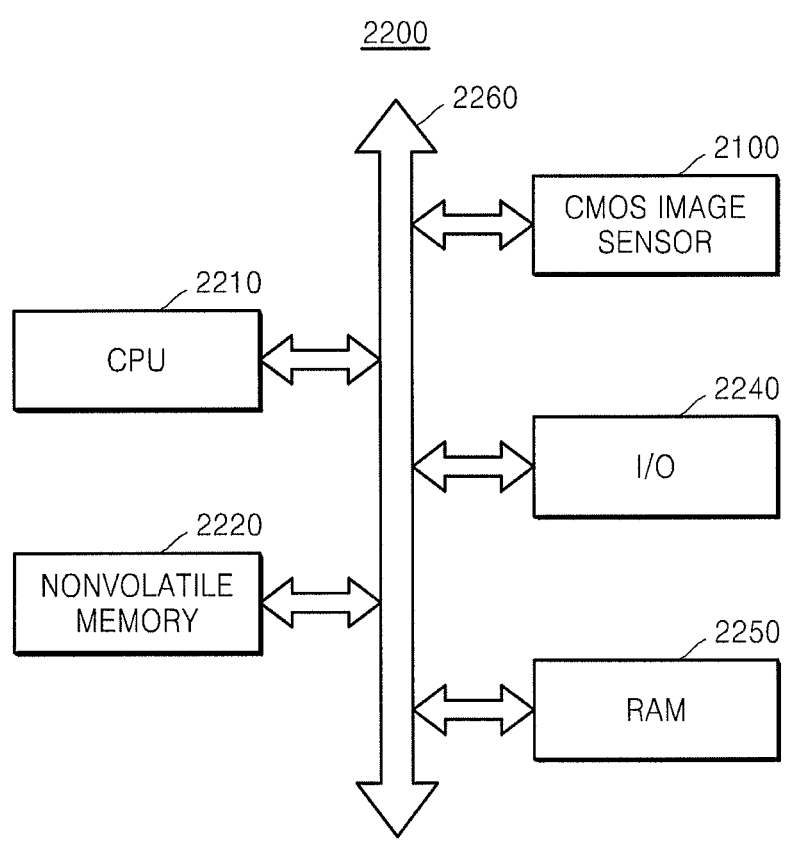
FIG. 8 illustrates a block diagram of a system including the CMOS image sensor of FIG. 7.

FIG. 8 is a block diagram illustrating a system 2200 including the CMOS image sensor 2100 of FIG. 7. The system 2200 may be, e.g., a computer system, a camera system, a scanner, a vehicle navigation element, a video phone, a security system, or a motion detecting system that requires image data.

Referring to FIG. 8, the system 2200 may include a processor 2210, e.g., a CPU 2210, a non-volatile memory 2220, the CMOS image sensor 2100, an input/output unit 2240, and a random access memory (RAM) 2250. The input/output unit 2240, the CMOS image sensor 2100, the RAM 2250, and the non-volatile memory 2220 communicate with the CPU 2210 via a bus 2260. The CMOS image sensor 2100 may be an independent semiconductor chip or may be combined with the CPU 2210 to be formed as a semiconductor chip.

The CMOS image sensor 2100 included in the system 2220 of FIG. 8 may include the backside illuminated APS array 100 illustrated in FIG. 5. Accordingly, image data with little crosstalk between adjacent pixels and without error may be output.

Example embodiments have been disclosed herein, and although specific terms are employed, they are used and are to be interpreted in a generic and descriptive sense only and not for purpose of limitation. For example, an n-type substrate and a positive voltage applied to an electrode could be used to generate a potential difference. Accordingly, it will be understood by those of skill in the art that various changes in form and details may be made without departing from the spirit and scope of the present invention as set forth in the following claims.

What is claimed is:

1. A backside illuminated image sensor, comprising:
a semiconductor substrate having a front side and a backside facing each other;
a plurality of light receiving elements in the semiconductor substrate, the light receiving elements corresponding to respective pixels and converting light incident on the backside of the semiconductor substrate to an electrical signal;
a first semiconductor layer on the front side of the semiconductor substrate;
a second semiconductor layer on the backside of the semiconductor substrate, the second semiconductor layer being connected to a voltage source; and
at least one active element at the front side of the semiconductor substrate,
wherein the first semiconductor layer is grounded, and
wherein the first and second semiconductor layers are p+ type semiconductor layers on opposite surfaces of the semiconductor substrate.

2. The backside illuminated image sensor as claimed in claim 1, wherein the semiconductor substrate is a p-type silicon substrate.

3. The backside illuminated image sensor as claimed in claim 2, wherein each of the light receiving elements is a photodiode with n-type dopants.

4. The backside illuminated image sensor as claimed in claim 1, wherein the voltage source is configured to apply voltage to the second semiconductor layer, the voltage source being a charge pump circuit outputting voltage or an external voltage source.

5. The backside illuminated image sensor as claimed in claim 1, wherein the voltage source is configured to apply negative voltage to the second semiconductor layer.

6. The backside illuminated image sensor as claimed in claim 1, further comprising:
a wiring layer on the front side of the semiconductor substrate; and
a filter layer and a lens layer on the backside of the semiconductor substrate.

7. The backside illuminated image sensor as claimed in claim 1, wherein the semiconductor substrate has a thickness of about 10 μm.

8. The backside illuminated image sensor as claimed in claim 1, wherein the first and second semiconductor layers are configured to have a potential difference therebetween.

9. The backside illuminated image sensor as claimed in claim 8, wherein the first and second semiconductor layers are configured to have an electric field therebetween directed toward the first semiconductor layer.

10. A system, comprising:
the backside illuminated image sensor as claimed in claim 1;
a processor communicating with the image sensor via a bus; and
an input/output unit communicating with the bus.

11. The backside illuminated image sensor as claimed in claim 1, wherein the at least one active element is one of a transfer transistor, a reset transistor, a driving transistor, and a selection transistor.

12. A backside illuminated image sensor, comprising:
a semiconductor substrate having a front side and a backside facing each other, light being incident on the backside of the semiconductor substrate;
a plurality of light receiving elements between the front side and backside of the semiconductor substrate, the light receiving elements being spaced apart from each other and corresponding to respective pixels;
a first semiconductor layer on the front side of the semiconductor substrate;
a second semiconductor layer on the backside of the semiconductor substrate, the first and second semiconductor layers being oppositely charged; and
at least one active element at the front side of the semiconductor substrate,
wherein the first and second semiconductor layers are p+ type semiconductor layers on opposite surfaces of the semiconductor substrate.

13. The backside illuminated image sensor as claimed in claim 12, wherein the light receiving element is on the front side of the semiconductor layer, and the second semiconductor layer is positively charged.

14. The backside illuminated image sensor as claimed in claim 12, wherein the first semiconductor layer is grounded, and the second semiconductor layer is connected to a negative voltage source.

15. The backside illuminated image sensor as claimed in claim 12, wherein the semiconductor substrate is a p-type silicon substrate and each of the light receiving elements is a photodiode with n-type dopants.

16. The backside illuminated image sensor as claimed in claim 12, wherein the at least one active element is one of a transfer transistor, a reset transistor, a driving transistor, and a selection transistor.

17. A backside illuminated image sensor, comprising:
a plurality of light receiving elements in a semiconductor substrate, the light receiving elements being spaced apart from each other and corresponding to respective pixels;
a semiconductor layer on a backside of the semiconductor substrate, the semiconductor layer being connected to an external voltage source supplying negative voltage;
an additional semiconductor layer on a front side of the semiconductor substrate, the additional semiconductor layer being grounded; and
at least one active element at the front side of the semiconductor substrate,
wherein the semiconductor layer and the additional semiconductor layer are p+ type semiconductor layers on opposite surfaces of the semiconductor substrate.

18. The backside illuminated image sensor as claimed in claim 17, further comprising:
a wiring layer on a front side of the semiconductor substrate; and
a filter layer and a lens layer on the backside of the semiconductor substrate.

19. The backside illuminated image sensor as claimed in claim 17, wherein the semiconductor substrate is a p-type silicon substrate and each of the light receiving elements is a photodiode with n-type dopants.

20. The backside illuminated image sensor as claimed in claim 17, wherein the at least one active element is one of a transfer transistor, a reset transistor, a driving transistor, and a selection transistor.

* * * * *